US007781936B2

(12) United States Patent
Nishimura et al.

(10) Patent No.: US 7,781,936 B2
(45) Date of Patent: Aug. 24, 2010

(54) SURFACE ACOUSTIC WAVE DEVICE HAVING GAP BETWEEN SURFACE ACOUSTIC WAVE FILTERS COVERED BY SEALER

(75) Inventors: Kazunori Nishimura, Kyoto (JP); Tetsurou Simamura, Kyoto (JP)

(73) Assignee: Panasonic Corporation, Osaka (JP)

( * ) Notice: Subject to any disclaimer, the term of this patent is extended or adjusted under 35 U.S.C. 154(b) by 2 days.

(21) Appl. No.: 12/280,587

(22) PCT Filed: Feb. 29, 2008

(86) PCT No.: PCT/JP2008/000395

§ 371 (c)(1),
(2), (4) Date: Aug. 25, 2008

(87) PCT Pub. No.: WO2008/114490

PCT Pub. Date: Sep. 25, 2008

(65) Prior Publication Data

US 2009/0096319 A1    Apr. 16, 2009

(30) Foreign Application Priority Data

Mar. 16, 2007  (JP)  ............... 2007-068403
Mar. 16, 2007  (JP)  ............... 2007-068404

(51) Int. Cl.
*H01L 41/08* (2006.01)

(52) U.S. Cl. .................. 310/313 R; 310/348; 333/187; 333/195

(58) Field of Classification Search ............... 310/313, 310/348; 333/187–195
See application file for complete search history.

(56) References Cited

U.S. PATENT DOCUMENTS

| 3,582,838 | A  | * | 6/1971 | DeVries ............... 333/194 |
| 6,698,084 | B2 | * | 3/2004 | Uchikoba ............... 29/601 |
| 2002/0043899 | A1 | * | 4/2002 | Kishimoto ............... 310/348 |
| 2003/0090338 | A1 | * | 5/2003 | Muramatsu ............... 333/133 |
| 2003/0214367 | A1 | * | 11/2003 | Uriu et al. ............... 333/132 |
| 2006/0238272 | A1 |   | 10/2006 | Iwamoto et al. |

FOREIGN PATENT DOCUMENTS

| JP | 3-36219 | 4/1991 |
| JP | 07-226607 | 8/1995 |
| JP | 2000-307383 | 11/2000 |
| JP | 2003-338729 | 11/2003 |
| JP | 2004-215218 | 7/2004 |
| JP | 2005-086615 | 3/2005 |
| JP | 2006-080921 | 3/2006 |
| JP | 2006-303931 | 11/2006 |
| JP | 2007-013261 | 1/2007 |
| WO | 2005/099090 | 10/2005 |

* cited by examiner

*Primary Examiner*—J. SanMartin
(74) *Attorney, Agent, or Firm*—Wenderoth, Lind & Ponack, L.L.P.

(57) ABSTRACT

A surface acoustic wave device includes a base substrate, first and second surface acoustic wave filters mounted on a surface of the base substrate, and a sealer provided on the surface of the base substrate and covering the first and second surface acoustic wave filters. The first and second surface acoustic wave filters include first and second piezoelectric substrates. The second piezoelectric substrate is located away from the first piezoelectric substrate via a gap. This surface acoustic wave device reduces inter-modulation.

6 Claims, 4 Drawing Sheets

SURFACE ACOUSTIC WAVE DEVICE HAVING GAP BETWEEN SURFACE ACOUSTIC WAVE FILTERS COVERED BY SEALER

TECHNICAL FIELD

The present invention relates to a surface acoustic wave device for use in, for example, a wireless communication apparatus.

BACKGROUND ART

A wireless communication apparatus including a terminal, such as a mobile telephone, corresponding to plural communication systems has been used. Such terminal includes plural filters corresponding to different frequency bands of the communication systems. The filters are generally implemented by surface acoustic wave filters, and a surface acoustic wave device including the surface acoustic wave filters is used.

A surface acoustic wave filter disclosed in JP 2006-80921A includes a base substrate, a piezoelectric substrate mounted onto the base substrate by flip-chip, comb electrodes mounted on the piezoelectric substrate, and a sealer made of resin or metallic material for sealing a surface of the piezoelectric substrate.

The base substrate having plural surface acoustic wave filters mounted and sealed thereon has a large size and may receive a large physical stress from the sealer. The stress produces a distortion on the base substrate, and the distortion is transferred to the surface acoustic wave filters mounted on the base substrate by flip-chip, causing inter-modulation (IM) characteristics of the device deteriorate. Particularly being used as transmitting filters, the surface acoustic filters have a large power signal supplied from a power amplifier, accordingly being affected by the deteriorating of the IM characteristics.

SUMMARY OF THE INVENTION

A surface acoustic wave device includes a base substrate, first and second surface acoustic wave filters mounted on a surface of the base substrate, and a sealer provided on the surface of the base substrate and covering the first and second surface acoustic wave filters. The first and second surface acoustic wave filters include first and second piezoelectric substrates. The second piezoelectric substrate is located away from the first piezoelectric substrate via a gap.

This surface acoustic wave device reduces inter-modulation.

DETAILED DESCRIPTION OF THE PREFERRED EMBODIMENTS

Exemplary Embodiment 1

Figure 1:
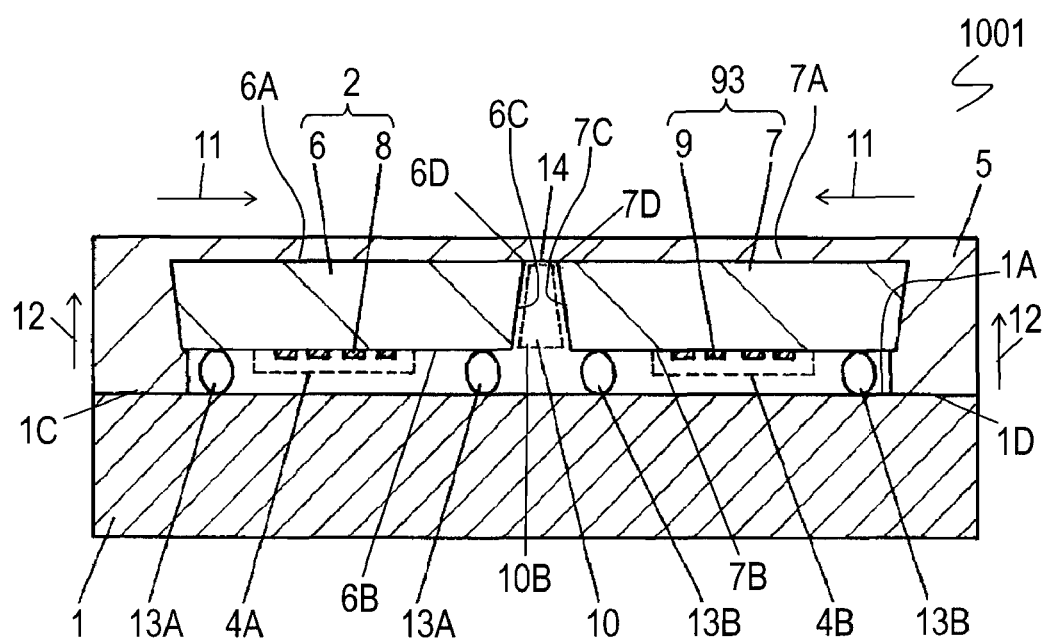
FIG. 1 is a cross sectional view of a surface acoustic wave device according to Exemplary Embodiment 1 of the present invention.

FIG. 1 is a cross sectional view of a surface acoustic wave device 1001 according to Exemplary Embodiment 1 of the present invention. Surface acoustic wave filters 2 and 93 are mounted onto a surface 1A of a base substrate 1 by flip-chip and bonded to the surface 1A with bumps 13A and 13B. The surface acoustic wave filters 2 and 93 are covered with a sealer 5 so as to produce oscillation spaces 4A and 4B, respectively. The sealer 5 covering the surface acoustic wave filters 2 and 93 extend beyond filters 2 and 93 to portions 1C and 1D of the surface 1A of the base substrate 1 which are at ends of the surface 1A opposite to each other. The surface acoustic wave filters 2 and 93 include piezoelectric substrates 6 and 7 made of piezoelectric material, such as lithium tantalate or lithium niobate, and comb electrodes 8 and 9 provided on respective main surfaces 6B and 7B of the piezoelectric substrates 6 and 7, respectively, thus constituting a filter circuit, such as a ladder type filter or a longitudinal mode filter. The main surfaces 6B and 7B face the surface 1A of the base substrate 1 across the oscillation spaces 4A and 4B, respectively. The surface acoustic wave filter 2 is used in the GSM900 communication system. The surface acoustic wave filter 93 is used in the DCS1800 communication system and has a passing frequency band different from that of the surface acoustic wave filter 2. The base substrate 1 is made of insulating material, such as alumina or glass ceramic. The sealer 5 is made of metal, such as solder, or resin having a plated surface. The piezoelectric substrates 6 and 7 are positioned away from each other via a gap 10 where the sealer 5 does not exist. More specifically, the piezoelectric substrates 6 and 7 face each other across the gap 10.

The piezoelectric substrates 6 and 7 are located between the portions 1C and 1D of the surface 1A of the base substrate 1. The sealer 5 is fixed to the portions 1C and 1D beyond the piezoelectric substrates 6 and 7. In the case that the sealer 5 is made of solder, the molten solder deforms to produce a contraction stress in direction 11 as it is solidified during the forming of the sealer 5. The contraction stress pulls the portions 1C and 1D of the base substrate 1 upward in direction 12 and deflects the base substrate 1. In the case that the piezoelectric substrates 6 and 7 are joined to each other, the deflection of the base substrate 1 causes distortion of the piezoelectric substrate 6 and 7 mounted to base substrate 1 via bumps 13A and 13B, thereby causing inter-modulation (IM) characteristics to deteriorate. In the surface acoustic wave device 1001 according to this embodiment, the surface acoustic wave filters 2 and 93 include the piezoelectric substrates 6 and 7 located away from each other, respectively, and allow the piezoelectric substrates 6 and 7 to have small areas. The piezoelectric substrates 6 and 7 are located away from each other via the gap 10, and reduce the influence of stress produced due to the deflection of the base substrate 1, accordingly preventing the IM characteristics from deteriorating.

The piezoelectric substrate 6 has a back surface 6A opposite to the main surface 6B and an edge surface 6C connected to the main surface 6B and the back surface 6A. Similarly, the piezoelectric substrate 7 has a back surface 7A opposite to the main surface 7B and an edge surface 7C connected to the main surface 7B and the back surface 7A. The gap 10 is provided between the edge surfaces 6C and 7C. The gap 10 has opening 10B between the main surfaces 6B and 7B and has opening 14 provided between the back surfaces 6A and 7A. The width of the gap 10 becomes smaller from the opening 10B to the opening 14. This structure prevents molten material of the sealer 5 from entering into the opening 14, thus forming the gap 10 easily during the forming of the sealer 5. The piezoelectric substrates 6 and 7 have edges 6D and 7D at the opening 14. Since the edges 6D and 7D have acute angles and may break, the edges 6D and 7D may preferably be chamfered.

The surface acoustic wave device including surface acoustic wave filters 2 and 93 mounted on piezoelectric substrates 6 and 7 separated from each other may have an overall size larger than a surface acoustic wave device including surface acoustic wave filters mounted on a single base substrate. While the thickness of the piezoelectric substrates 6 and 7 is about 200 μm, the width of the opening 14 which is narrowest in the gap 10 is as small as 90 μm. The width of the gap 10 (the opening 14) between the piezoelectric substrates 6 and 7 is smaller than the half of the thickness of each of the piezoelectric substrates 6 and 7. This arrangement minimizes the width in view of the mounting accuracy of the filters 2 and 93 and the deflection of the piezoelectric substrates 6 and 7. This prevents the surface acoustic wave device 1001 from having a large size, and effectively prevents the IM characteristics from deteriorating.

In the surface acoustic wave device 1001 according to Embodiment 1, the sealer 5 is made of solder, but may include resin material and a plated coating provided at a surface of the resin material. In this case, the stress on the plated coating acts on the base substrate 1 in the same manner as the stress on the soldering metal, providing the same effects as the surface acoustic device 1001.

Exemplary Embodiment 2

Figure 2:
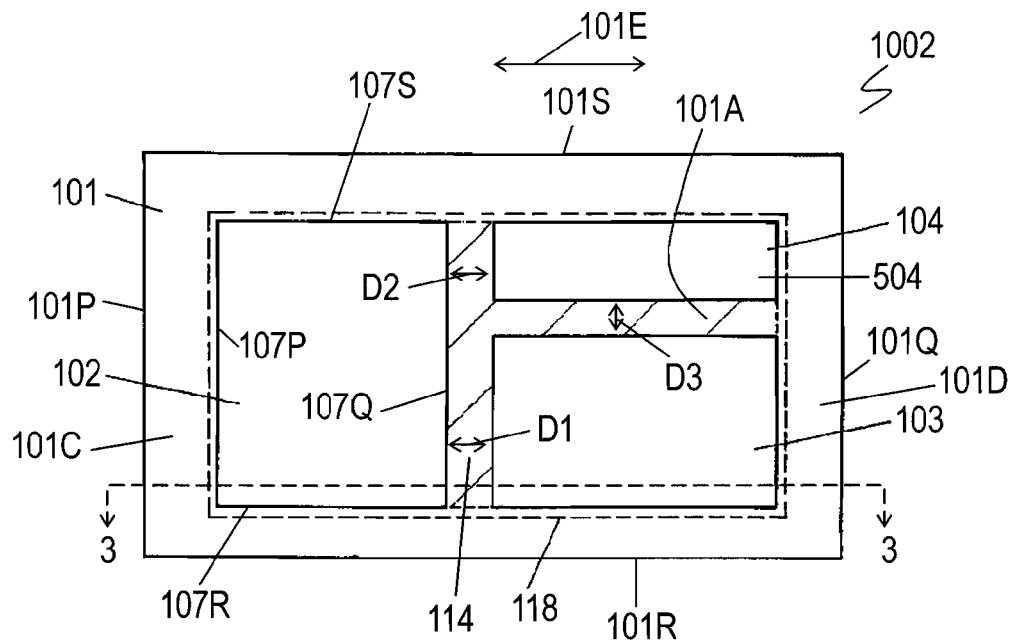
FIG. 2 is a schematic view of a surface acoustic wave device according to Exemplary Embodiment 2 of the invention.

FIG. 2 is a plan view of a surface acoustic wave device 1002 according to Exemplary Embodiment 2 of the present invention. The surface acoustic wave device 1002 includes a base substrate 101 having a rectangular shape. Surface acoustic wave filters 102 and 103 and a component 104 are mounted onto the surface 101A of the base substrate 101 by flip-chip. According to Embodiment 2, the component 104 is a phase shifter. The surface acoustic wave filters 102 and 103 and the components 104 have rectangular shapes. The surface acoustic wave filter 102 functions as a transmitting filter while the surface acoustic wave filter 103 functions as a receiving filter. The surface acoustic wave device 1002 thus functions as a surface acoustic wave duplexer.

Figure 3:
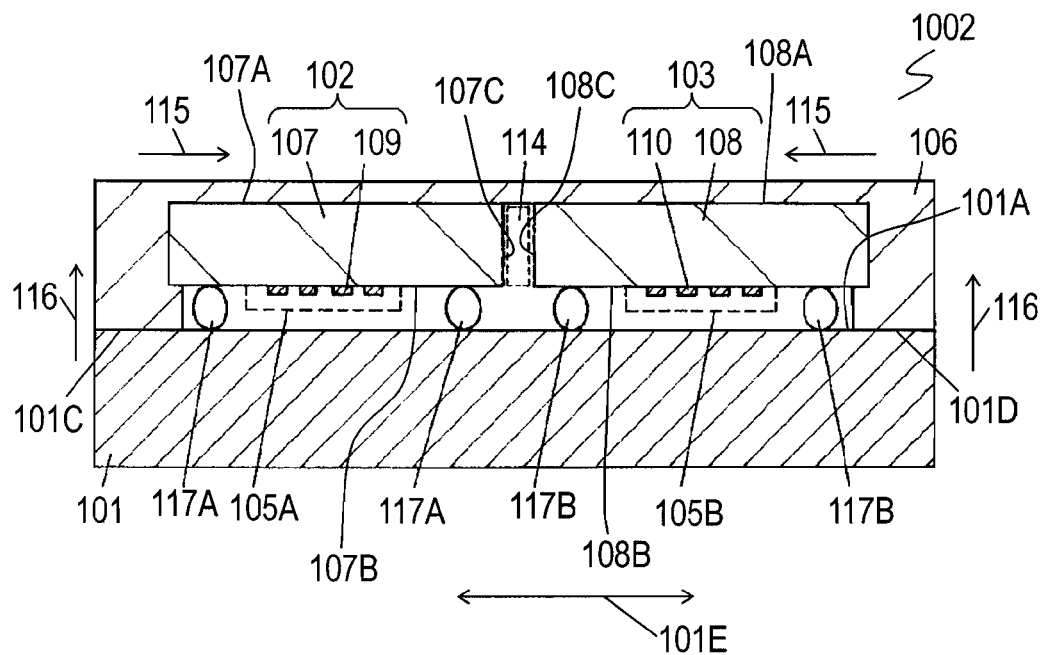
FIG. 3 is a cross sectional view of the surface acoustic wave device at line 3-3 shown in FIG. 2.

FIG. 3 is a cross sectional view of the surface acoustic wave device 1002 at line 3-3 shown in FIG. 2. The surface acoustic wave filters 102 and 103 are mounted on the surface 101A of the base substrate 101 by flip-chip, and bonded to the surface 101A with bumps 117A and 117B, respectively. The surface acoustic wave filters 102 and 103 are covered with a sealer 106 so as to produce oscillation spaces 105A and 105B, respectively. The sealer 106 covering the surface acoustic wave filters 102 and 103 is provided on portions 101C and 101D of the surface 101A of the base substrate 101 which are edges opposite to each other. The surface acoustic wave filters 102 and 103 include piezoelectric substrates 107 and 108 made of piezoelectric material, such as lithium tantalate or lithium niobate, and comb electrodes 109 and 110 provided on main surfaces 107B and 108B of the piezoelectric substrates 107 and 108, respectively. That is, the main surfaces 107B and 108B face the surface 101A of the base substrate 101 across the oscillation spaces 105A and 105B, respectively.

Figure 4:
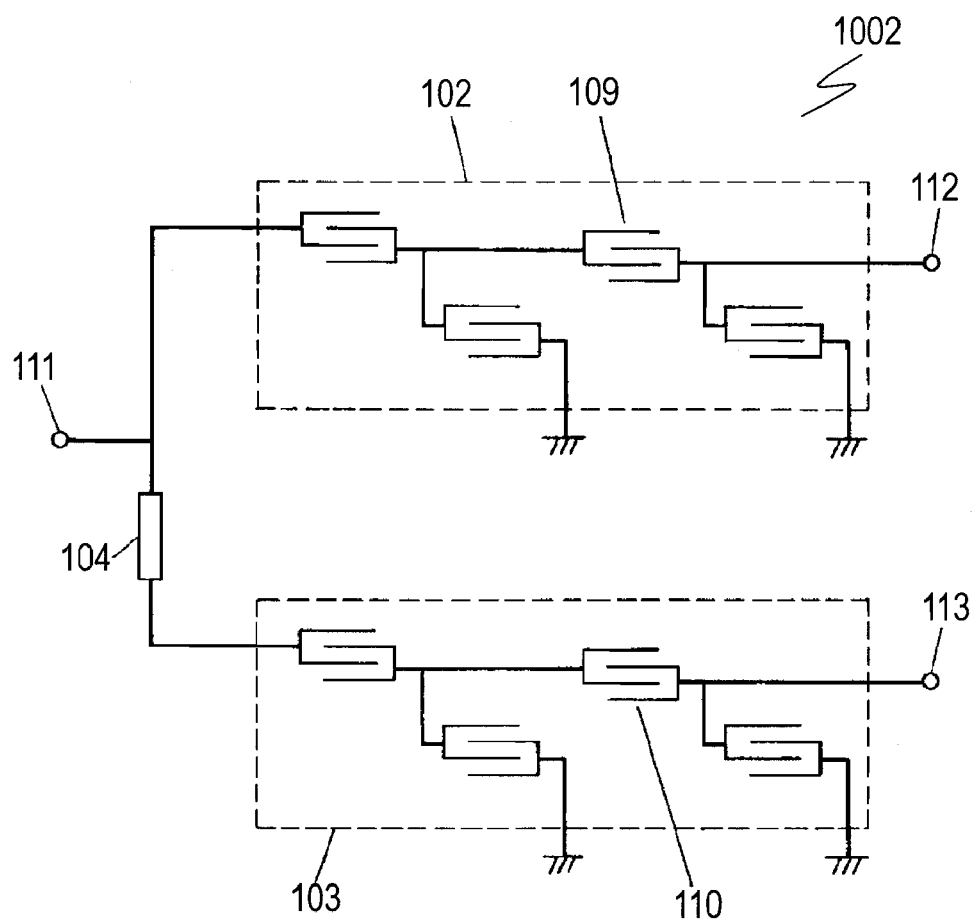
FIG. 4 is an equivalent circuit of the surface acoustic wave device according to Embodiment 2.

FIG. 4 is a circuit diagram of the surface acoustic wave device 1002. The surface acoustic wave device 1002 includes a common terminal 111, a transmitting terminal 112 arranged to be connected to a transmitting circuit, and a receiving terminal 113 arranged to be connected to a receiving circuit. The surface acoustic wave filter 102 is connected between the common terminal 111 and the transmitting terminal 112. The surface acoustic wave filter 102 is arranged to receive a power larger than a power supplied to the surface acoustic wave filter 103. The comb electrodes 109 of the surface acoustic wave filter 102 are connected in a ladder shape to constitute a ladder type filter circuit having large resistance to high power so as to be sufficient as the transmitting filter. The comb electrodes 110 of the surface acoustic wave filter 103 are connected in the ladder shape to constitute a ladder type filter circuit having large resistance to high power.

The component 104 functioning as the phase shifter for matching the surface acoustic wave filter 102 with the surface acoustic wave filter 103 is connected between the common terminal 111 and the surface acoustic wave filter 103. The component 104 includes an insulating substrate 504 made of insulating material, such as glass, and an inductor line provided on the insulating substrate 504. The component 104 may include a line, such as a capacitor electrode line, other than the inductor line provided on the insulating substrate 504.

The base substrate 101 is made of insulating material, such as alumina or glass ceramic. The sealer 106 is made of metal, such as solder, or resin having a plated surface. The piezoelectric substrates 107 and 108 are located away from each other via a gap 114. That is, the piezoelectric substrates 107 and 108 face each other at least partially across the gap 114.

As shown in FIG. 2, the surface 101A of the base substrate 101 has a rectangular shape having short sides 101P and 101Q opposite to each other and long sides 101R and 101S opposite to each other and longer than the short sides 101P and 101Q. The base substrate 101 extends along a longitudinal direction 101E parallel to the long sides 101R and 101S. The main surface 107B of the piezoelectric substrate 107 of the surface acoustic wave filter 102 has a rectangular shape having sides 107P and 107Q opposite to each other and sides 107R and 107S opposite to each other. The surface acoustic wave filter 102 is mounted on the surface 101A of the base substrate 101 such that side 107P extends in parallel with the short side 101P of the base substrate 101. The surface acoustic wave filter 103 and the component 104 are mounted on the surface 101A of the base substrate 101 between the side 107Q of the surface acoustic wave filter 102 and the short side 101Q of the base substrate 101, and are arranged in parallel with the sides 107Q and 101Q. The insulating substrate 504 of the component 104 is located away from the piezoelectric substrates 107 and 108 via the gap 114. That is, the insulating substrate 504 faces the piezoelectric substrates 107 and 108 across the gap 114.

The piezoelectric substrates 107 and 108 are located between the portions 101C and 101D of the surface 101A of the base substrate 101. The sealer 106 is fixed to the portions 101C and 101D beyond the piezoelectric substrates 107 and 108. In the case that the sealer 106 is made of solder, the solder melting produces a contraction stress in a direction 115 as being solidified during the forming of the sealer 106. The contraction stress pulls the portions 101C and 101D of the base substrate 101 upward in a direction 116 and deflects the base substrate 101. If the piezoelectric substrates 107 and 108 were joined to each other, the deflection of the base substrate 101 would cause distortion of the piezoelectric substrates 107 and 108 mounted to the base substrate 101 via the bumps 117A and 117B, thereby causing inter-modulation (IM) characteristics to deteriorate. In the surface acoustic wave device 1002 according to this embodiment, the surface acoustic wave filters 102 and 103 and the component 104 include the piezoelectric substrates 107 and 108 and the insulating substrate 504 located away from each other, thereby reducing the areas of the substrates 104, 107, and 108. The piezoelectric substrates 107 and 108 and the insulating substrate 504 are located away from each other via the gap 114, and reduce an influence of the stress produced due to the deflection of the base substrate 101, accordingly preventing the IM characteristics from deteriorating.

Since the base substrate 101 has the rectangular shape, the contraction stress on the sealer 106 affects the substrate 101 particularly in the longitudinal direction 101E and deflects the base substrate 101 in the longitudinal direction 101E parallel to the long sides 101R and 101S more than in a direction parallel to the short sides 101P and 101Q. The deflection of the base substrate 101 may preferably give effect to the surface acoustic wave filter 102 functioning as a transmitting filter transmitting a large power less than to the surface acoustic wave filter 103 and the component 104. In the surface acoustic wave device 1002 according to Embodiment 2, the width of the base substrate 101 along the longitudinal direction 101E (the length of the short sides 101P and 101Q) is greater than the width of the base substrate 101 along the direction perpendicular to the longitudinal direction 101E (the length of the long sides 101R and 101S). Both the surface acoustic wave filter 103 and the component 104 are arranged along the side 107Q of the surface acoustic wave filter 102 and between the surface acoustic wave filer 102 and the short side 101Q of the base substrate 101. This arrangement allows the width of the surface acoustic wave filter 102 along the longitudinal direction 101E to be smaller than the width of the surface acoustic wave filter 103 along the longitudinal direction 101E.

The shape of component 104 including the inductor line and the insulating substrate 504 may be determined more arbitrarily than the shapes of surface acoustic wave filters 102 and 103 including the comb electrodes 109 and 110. Therefore, the component 104 may be located relatively arbitrarily in a region of the surface 101A of the base substrate 101 other than the surface acoustic wave filters 102 and 103. While the surface acoustic wave filter 103 and the component 104 are arranged in the direction perpendicular to the longitudinal direction 101E and along the short side 101Q of the base substrate 101, the surface acoustic wave filter 102 and the component 104 are arranged in the longitudinal direction 101E of the base substrate 101. The surface acoustic wave filters 102 and 103 are arranged along the longitudinal direction 101E of the base substrate 101. This arrangement provides a large width of the piezoelectric substrate 107 (the surface acoustic wave filter 102) along the direction perpendicular to the longitudinal direction 101E of the base substrate 101, accordingly reducing the width of the piezoelectric substrate 107 along the longitudinal direction 101E. In other words, even if the sides 107P and 107Q are longer than the sides 107R and 107S of the piezoelectric substrate 107 of the surface acoustic wave filter 102, the surface acoustic wave filter 102 can be mounted on the surface 101A of the base substrate 101 so that the long sides 107P and 107Q extend in parallel with the short side 101P of the base substrate 101. Further, the short sides 107R and 107S of the piezoelectric substrate 107 may extend in parallel with the long side 101R of the base substrate 101 and along the longitudinal direction 101E. As a result, the width of the surface acoustic wave filter 102 along the longitudinal direction 101E of the base substrate 101 can be larger than the width of than the surface acoustic wave filter 103 along the longitudinal direction 101E.

The surface acoustic wave filter 102, the surface acoustic wave filter 103, and the component 104 are separated from each other. The surface acoustic wave filter 103 and the component 104 are arranged along the side 107Q of the surface acoustic wave filter 102 and between the short side 101Q of the base substrate 101 and the surface acoustic wave filter 102. In this case, the surface acoustic wave filter 102, the surface acoustic wave filter 103, and the component 104 can be located on a rectangular region 118 of the surface 101A of the base substrate 101. The distance D1 at the gap 114 between the surface acoustic wave filter 102 (the piezoelectric substrate 107) and the surface acoustic wave filter 103 (the piezoelectric substrate 108), the distance D2 between the surface acoustic wave filter 102 and the component 104, and the distance D3 between the surface acoustic wave filter 103 and the component 104 may be substantially equal to each other. This arrangement allows the contraction stress on the sealer 106 to concentrate on an outer periphery of the surface 101A of the base substrate 101. Accordingly, the contraction stress is directed towards a center of the base substrate 101 and deflects the base substrate 101 strictly along the longitudinal direction 101E but rarely along the direction perpendicular to the longitudinal direction 101E. Thus, the surface acoustic wave filters 102 and 103 are not affected by the deflection of the base substrate 101, accordingly stabilizing the IM characteristics of the surface acoustic wave device 1002.

Respective heights of the surface acoustic wave filter 102, the surface acoustic wave filter 103, and the component 104 mounted on the surface 101A of the base substrate 101 from the surface 101A may be arranged substantially equal to each other. This arrangement allows the thickness of a portion of the sealer 106 covering those components to be uniform. Thus, the portion of the sealer 106 has the uniform thickness, and hence, allows the contraction stress applied to the portion to be uniform throughout the components. This arrangement allows the base substrate 101 to deflect in a constant direction due to the contraction stress on the sealer 106 during the forming of the sealer 106, thus stabilizing the IM characteristics of the surface acoustic wave device 1002 during mass production of the device.

In the surface acoustic wave device 1002 according to Embodiment 2, the sealer 106 is made of solder, but may be made of material including resin and plated coating on a surface thereof. In this case, the stress on the plated coating is applied onto the base substrate 101 as well as the stress on the solder, providing the same effects.

Figure 5:
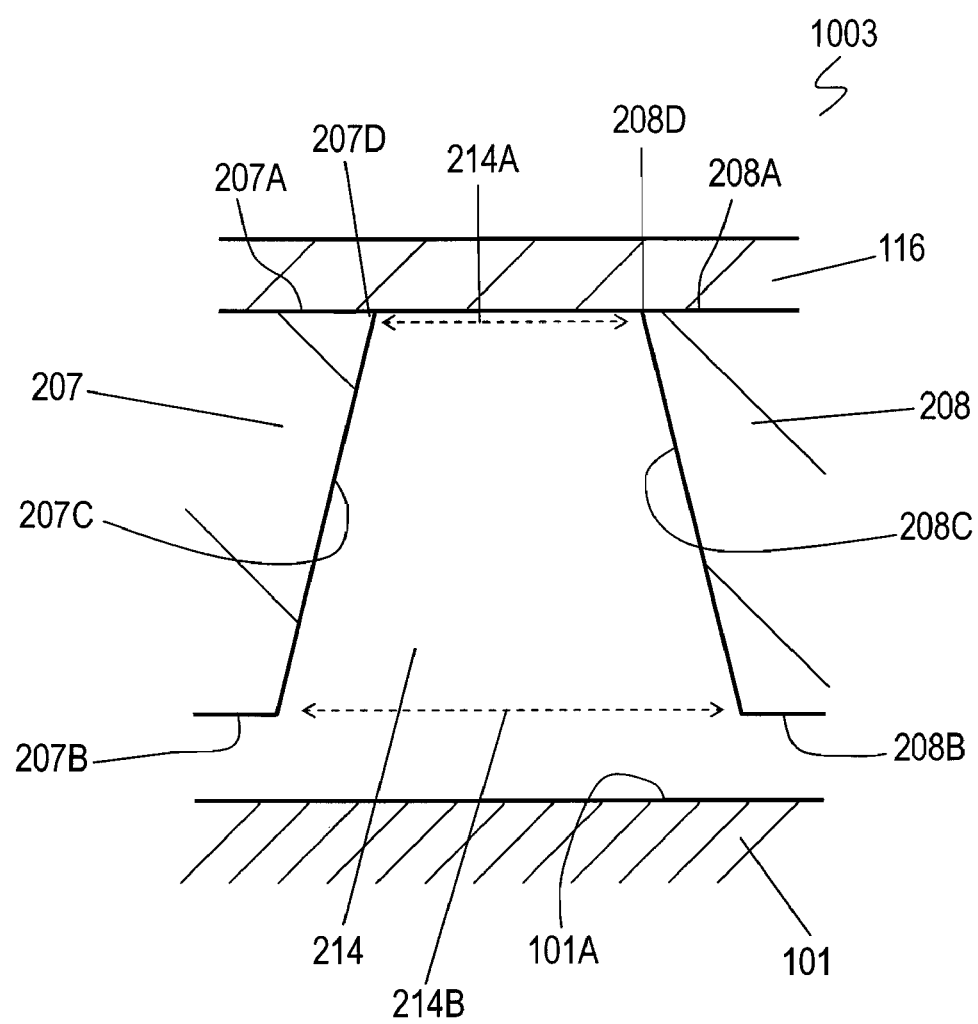
FIG. 5 is an enlarged cross sectional view of another surface acoustic wave device according to Embodiment 2.

FIG. 5 is an enlarged cross sectional view of another surface acoustic wave device 1003 according to Embodiment 2. In FIG. 5, components identical to those of the surface acoustic wave device 1002 shown in FIG. 3 are denoted by the same reference numerals, and their description will be omitted. The surface acoustic wave device 1003 includes piezoelectric substrates 207 and 208 instead of the piezoelectric substrates 107 and 108 of the surface acoustic wave filters 102 and 103 of the surface acoustic wave device 1002 shown in FIG. 3. Similar to the surface acoustic wave device 1002 shown in FIG. 3, a gap 214 is provided between the two piezoelectric substrates 207 and 208. That is, the piezoelectric substrates 207 and 208 are located away from each other. The piezoelectric substrates 207 and 208, similarly to the surface acoustic wave device 1002 shown in FIG. 3, have main surfaces 207B and 208B having comb electrodes formed thereon. Main surfaces 207B and 208B face the surface 101A of the base substrate 101. The piezoelectric substrate 207 has a back surface 207A opposite to the main surface 207B and an edge surface 207C connected to the main surface 207B and the back surface 207A. The piezoelectric substrate 208 has a back surface 208A opposite to the main surface 208B and an edge surface 208C connected to the main surface 208B and the back surface 208A. The edge surfaces 207C and 208C face each other across the gap 214.

The gap 214 is provided between the edge surfaces 207C and 208C, and has an opening 214B provided between the main surfaces 207B and 208B, and has an opening 214A provided between the back surfaces 207A and 208A. The width of the gap 214 becomes smaller from the opening 214B to the opening 214A. This shape prevents molten material of the sealer 5 from entering the opening 214A during the forming of the sealer 5, hence forming the gap 214 easily. Edges 207D and 208D of the piezoelectric substrates 207 and 208 facing the opening 214A have acute angles and break easily, and hence, may preferably be chamfered.

A surface acoustic wave device according to the present invention reduces inter-modulation and is useful as a surface acoustic wave device, such as a dual filter device or a surface acoustic wave duplexer, including surface acoustic wave filters for use in a radio communication apparatus.

The invention claimed is:

1. A surface acoustic wave device comprising:
a base substrate having a surface;
a first surface acoustic wave filter mounted on the surface of the base substrate, the first surface acoustic wave filter including
a first piezoelectric substrate having a first main surface facing the surface of the base substrate, and
a first comb-electrode provided on the first main surface;
a second surface acoustic wave filter mounted on the surface of the base substrate, the second surface acoustic wave filter including
a second piezoelectric substrate located away from the first piezoelectric substrate via a gap, the second piezoelectric substrate having a second main surface facing the surface of the base substrate, and
a second comb-electrode provided on the second main surface; and
a sealer provided on the surface of the base substrate, the sealer covering the first surface acoustic wave filter and the second surface acoustic wave filter;
wherein the first piezoelectric substrate further has a first back surface opposite to the first main surface, and a first edge surface connected to the first main surface and the first back surface;
wherein the second piezoelectric substrate further has a second back surface opposite to the second main surface, and a second edge surface connected to the second main surface and the second back surface;
wherein the gap is provided between the first edge surface of the first piezoelectric substrate and the second edge surface of the second piezoelectric substrate, and has a first opening and a second opening, the first opening being located between the first main surface and the second main surface, the second opening being located between the first back surface and the second back surface; and
wherein a width of the gap becomes smaller from the first opening to the second opening such that the gap narrows in a direction extending away from the surface of the base substrate.

2. The surface acoustic wave device according to claim 1, further comprising a component mounted on the surface of the base substrate, wherein
the sealer covers the first surface acoustic wave filter, the second surface acoustic wave filter, and the component,
the surface of the base substrate has a rectangular shape having first and second short sides opposite to each other and having first and second long sides opposite to each other, the first and second long sides being longer than the first and second short sides, the rectangular shape extending along a longitudinal direction parallel to the first and second long sides,
the first surface acoustic wave filter is arranged along the first short side of the surface of the base substrate, and
the second surface acoustic wave filter and the component are arranged between the second short side of the surface of the base substrate and the first surface acoustic wave filter.

3. The surface acoustic wave filter according to claim 1, wherein the sealer is made of material which can deform while being solidified.

4. The surface acoustic wave filter according to claim 1, wherein the first surface acoustic wave filter and the second surface acoustic wave filter as a transmitting filter and a receiving filter provide a surface acoustic wave duplexer, respectively.

5. The surface acoustic wave filter according to claim 1, wherein the first surface acoustic wave filter, the second surface acoustic wave filter, and the component as a transmitting filter, a receiving filter, and a phase shifter provide a surface acoustic wave duplexer, respectively.

6. The surface acoustic wave device according to claim 5, wherein the first filter, the second filter, and the component are located on a region of the surface of the base substrate having a substantially rectangular shape.

* * * * *